US012760409B2

(12) United States Patent

Hergenröther et al.

(10) Patent No.: US 12,760,409 B2
(45) Date of Patent: Oct. 13, 2026

(54) METHOD AND DEVICE FOR CHANGING TEST SUBSTRATES IN A CONTINUOUS-FLOW VACUUM SYSTEM, TREATMENT METHOD, AND CONTINUOUS-FLOW VACUUM SYSTEM

(71) Applicant: Solayer GmbH, Karlstein (DE)

(72) Inventors: Jens Hergenröther, Gross-Zimmern (DE); Andreas Rack, Großkrotzenburg (DE); Florian Schwarz, Aschaffenburg (DE); Peter Rettenbacher, Frankfurt (DE); Thomas Merz, Aschaffenburg (DE)

(73) Assignee: Solayer GmbH, Karlstein (DE)

( * ) Notice: Subject to any disclaimer, the term of this patent is extended or adjusted under 35 U.S.C. 154(b) by 653 days.

(21) Appl. No.: 18/258,022

(22) PCT Filed: Dec. 16, 2021

(86) PCT No.: PCT/DE2021/200265
§ 371 (c)(1),
(2) Date: Jun. 16, 2023

(87) PCT Pub. No.: WO2022/128026
PCT Pub. Date: Jun. 23, 2022

(65) Prior Publication Data
US 2024/0102155 A1 Mar. 28, 2024

(30) Foreign Application Priority Data
Dec. 17, 2020 (DE) ......................... 102020134000.1

(51) Int. Cl.

| | |
|---|---|
| ***C23C 14/56*** | (2006.01) |
| ***C23C 14/24*** | (2006.01) |
| ***C23C 14/50*** | (2006.01) |

(52) U.S. Cl.
CPC ............ *C23C 14/568* (2013.01); *C23C 14/24* (2013.01); *C23C 14/505* (2013.01)

(58) Field of Classification Search
None
See application file for complete search history.

(56) References Cited

U.S. PATENT DOCUMENTS 4,828,391 A 5/1989 Zultzke et al.
5,803,521 A * 9/1998 Zejda ...................... C23C 14/50 294/195

(Continued)

FOREIGN PATENT DOCUMENTS

| | | | |
|---|---|---|---|
| DE | 102008056125 | A1 | 5/2010 |
| EP | 3567129 | A1 | 11/2019 |
| TW | 201331546 | | 8/2013 |

*Primary Examiner* — Jason Berman
(74) *Attorney, Agent, or Firm* — Kolitch Romano Dascenzo Gates LLP

(57) ABSTRACT

A method for changing test substrates in a continuous-flow vacuum system in a multiple-treatment-step process cycle for treating a substrate, a treatment method using the method for changing test substrates, and systems for treating a plurality of substrates (61) and for changing test substrates. For at least two treatment steps, at least two test substrates (66) are transferred to a vacuum treatment system at the beginning of the process cycle and are transferred back out once the process cycle is concluded. Subsequently, the first test substrate (66) concurrently treated in this step is removed from the measurement position (70) it occupied during the treatment and is deposited in an empty position (71) without a test substrate (66). Subsequently, the second test substrate (66) which has not been treated yet is deposited in the resulting free measurement position (70) for the purpose of supplying the second test substrate to the subsequent treatment step.

9 Claims, 4 Drawing Sheets

(56) References Cited

U.S. PATENT DOCUMENTS

Figure 1:
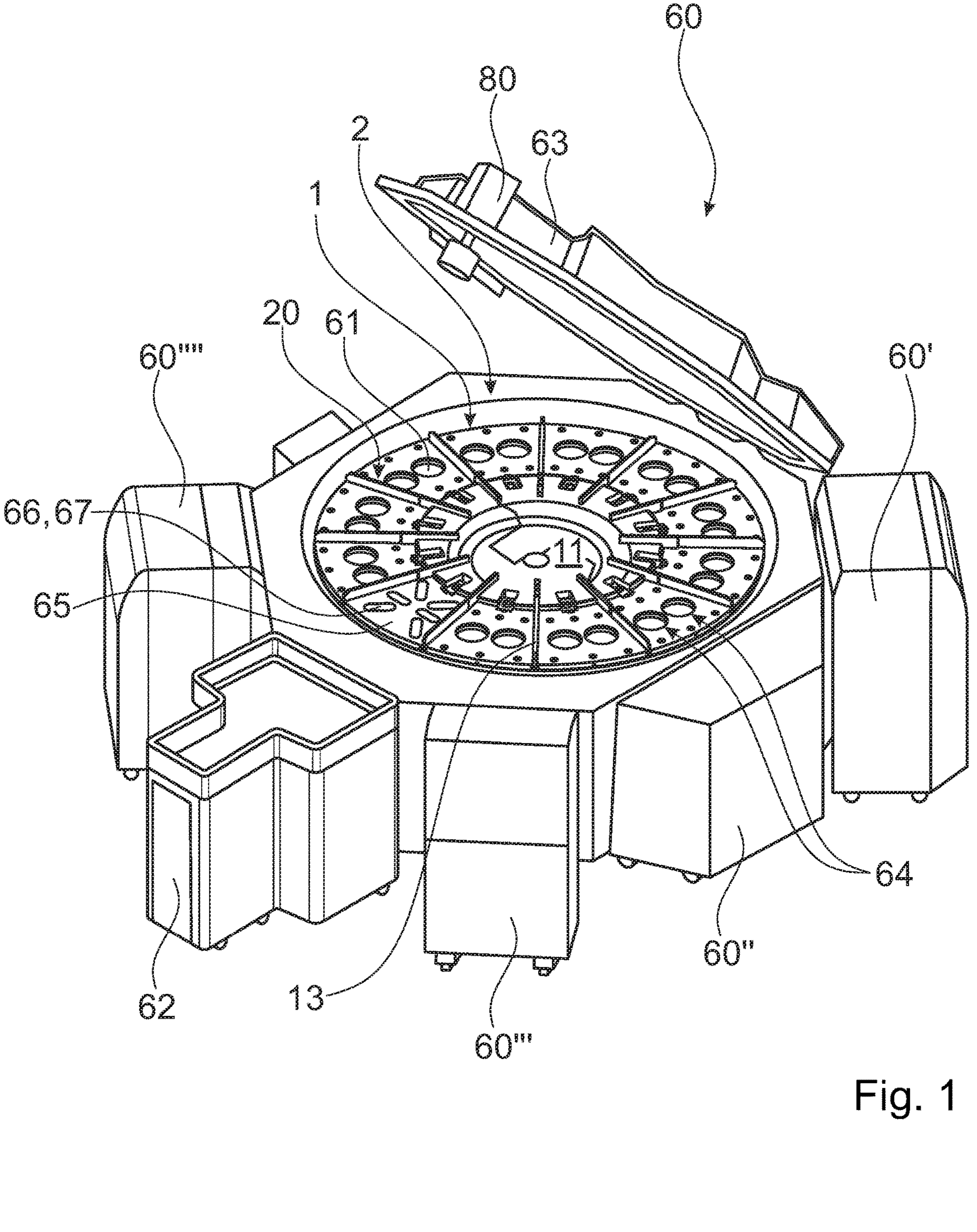

| | | | | |
|---|---|---|---|---|
| 2005/0205209 | A1 | 9/2005 | Mosden | |
| 2008/0075858 | A1* | 3/2008 | Koh | H01L 21/02181 118/704 |
| 2011/0265583 | A1 | 11/2011 | Scherer | |
| 2012/0225195 | A1* | 9/2012 | Yudovsky | C23C 16/45551 427/58 |

* cited by examiner

METHOD AND DEVICE FOR CHANGING TEST SUBSTRATES IN A CONTINUOUS-FLOW VACUUM SYSTEM, TREATMENT METHOD, AND CONTINUOUS-FLOW VACUUM SYSTEM

The invention relates to a method for changing test substrates, hereinafter also referred to as test glasses, in a vacuum treatment system and to a device for carrying out the method.

A wide variety of substrates, for example substrates for optical or photovoltaic applications; semiconductor substrates or others, are subjected to various treatments. Here, treatment is to be understood as the known modifying, additive and subtractive treatments, i.e. processes in which the substrate or layers present on the substrate are structurally or energetically modified, and material is deposited on the substrate or removed from the substrate. In most cases, very complex method sequences are required, which comprise several of the treatment methods mentioned. The entire treatment is carried out in one pass and regularly without breaking the vacuum.

The continuous-flow vacuum systems used for this purpose comprise a sequence of treatment stations in their vacuum chamber, which are passed through one after the other in order to achieve the desired treatment result of the substrate at the end of the flow. Both the vacuum chamber and the treatment stations have the necessary and known equipment for the particular treatment, such as a vacuum system, treatment sources, process gas equipment, coolants, plates, measuring equipment, control units and much more.

Continuous flow systems can perform a linear or a circular transport of the substrates through the sequence of treatment stations.

In the following, the method according to the invention and the devices that can be used for it will be described by way of example using a turntable system. Similarly, the invention can also be used for linear continuous-flow systems, provided that the substrate transport is suitable and designed for the procedure described below for the invention.

Those parts of the substrate holder and transport device which hold the substrates during a process sequence with the associated movement sequences are to be referred to here generally as carriers. They are adapted to the particular requirements according to the configuration of the treatment system and the type and geometry of the substrates and are generally known.

A so-called turntable system has several circumferentially arranged process portions in a treatment chamber, which are separated from each other both spatially and in terms of process technology. The process portions are used for the treatment itself as well as any necessary pre- and post-treatment and/or handling procedures of the substrates. The treatment chamber is hermetically sealed by means of a chamber lid. The chamber wall and the chamber lid are fixed, non-rotating components of the system. A treatment run of a substrate through such a system is carried out by activating the required process portions one after the other, while the substrate in question rotates with all others by means of a suitable substrate holding device at the required, often high, rotational speeds.

The term "treatment" is intended to mean various additive, subtractive, or modifying treatments of the surface of a substrate, which may include treatment of the substrate itself, such as a heat treatment, pre-treatments such as cleaning or activation processes, and others, within the system. Additive treatments include a wide variety of coatings. Subtractive treatments include the complete or partial removal of surface layers, whether parasitic or previously applied, particularly with physical or chemical processes, and likewise mechanical treatments. Modification is known as changes in the structure or composition of a surface layer, for example by means of heat or plasma exposure or chemical treatments. A common application of turntable systems is the production of optical glasses, on which layer stacks are deposited that have the desired optical properties.

To adjust and monitor the treatments, several test substrates, referred to as test glasses in reference to optical applications, are treated with the substrates under the desired treatment conditions of the actual substrates and analyzed using suitable monitoring systems, preferably in situ. In order to verify individual treatment steps, it is necessary to treat test substrates together with the substrates only during this treatment step and to replace them with new test substrates before the subsequent step. In other words, test substrates have to be changed regularly, which includes a removal from the treatment system and the introduction of a new test substrate into the system.

The test substrate change is very labor-, energy- and time-consuming in the known treatment systems, such as turntable systems. First, each test substrate and, if necessary, the associated carrier, for example a carrier of the existing substrate holder and/or substrate transport device, must be transported and loaded into the magazine lock. There, it must be moved into a position where a test substrate changer can be positioned and the test substrate change can be performed. Subsequently, the carrier loaded with a new test substrate is returned to the treatment system. This procedure must be repeated several times during a process run.

As the procedure is very complex and time-consuming, the carrier cools down significantly during each change and must then first be brought back into line with the temperature of the directly and indirectly neighboring components remaining in the treatment system, for example other carriers and/or their holders. In addition, it is very time-consuming to load the test substrate changer on the magazine lock with new test substrates or to unload used test substrates. Keeping several test substrates in the carrier magazine is also only suitable to a limited extent for making the test substrate change more effective, since in this case no substrate to be treated can be arranged on the carrier of the test substrate.

The object of the invention is to overcome the disadvantages of the prior art. The method and device are intended to serve for coating, alternatively also for the further treatment methods mentioned above.

The concept of the invention can be described in that all test substrates required for a process run are fed in together with the substrates and carriers of this process run, for example turntable segments. The test substrates are held in suitable holders on one or more or on all carriers. In this way, a change of test substrates is only necessary when the process run is completed and therefore the system is opened.

According to the invention, the arrangement of the plurality of test substrates of the process run to be carried out takes place in three different position types. In a first position type, the measuring position, a test substrate is treated and can be analyzed in situ. In this position, the test substrate is "visible" to the treatment device and the test substrate is also treated, analogously to or together with the substrates. The analysis of the test substrate concerns relevant layer properties, such as optical or electrical properties or others. Further, there are positions that only support test substrates, treated and untreated. In these holding positions, the test substrates are protected from the effects of the treatment. In addition, there is at least one test substrate empty position on the carrier. The latter can serve as an intermediate storage place in the handling sequence of the test substrates during a process run.

The use of the plurality of test substrates in a process run is as follows:

A first test substrate, namely the one in a measuring position, is treated with the substrates and analyzed in a first process phase. Once the completion of the treatment step has been determined by means of a suitable monitoring system, the test substrate in the measuring position must be replaced by a new one.

For this purpose, the first test substrate is removed from the measuring position and deposited in an empty position. To pick up and deposit a test substrate, the rotating turntable is stopped and the used test substrate is lifted and deposited by means of a suitable loading station of the treatment system described below. By means of said loading station, in conjunction with the clocking (rotation) of the turntable, any test substrate position on the turntable and on a carrier can be reached. The previously used test substrate is now exchanged for one of the other test substrates that are still untreated and traveling together with the turntable by continuing to clock the turntable and by using the intermediate storage place.

A second, unused test substrate is then removed from a holding position and placed in the measuring position for monitoring the next treatment step.

This exchange of used and unused test substrates and use of the newly created empty position in each case is repeated until all treatment steps to be verified have been completed.

After completion of the treatment, the treated substrates and with them the treated test substrates can be discharged from the system.

The term “substrate position” or “test substrate position” is used here to describe positions on a carrier which are formed by a suitable holder to accommodate a single substrate or a single test substrate. The holders themselves are dependent here on the type and shape of the particular substrate and test substrate.

It is apparent that more than one measuring or empty position can also be used. However, there is a general desire for high efficiency, and therefore the area on the substrate holder that cannot be used for substrate treatment is always kept as small as possible. Through trials or simulations, the number of test substrates required for a process run can be precisely determined and optimized.

In most cases, it is not necessary for the geometry of the test substrates to correspond to that of the substrates, and therefore optimization of the treatable substrate areas can also be achieved in this way.

The position of the various test substrate positions can also be adjusted for an effective and optimal treatment result.

In a first variant of the method according to the invention, all test substrates required for a process run are distributed in the corresponding positions on several carriers of the substrate holder, so that each carrier preferably has only one test substrate in one of the three possible position types. In this variant, a test substrate change involves at least three carriers. Such carriers, which predominantly have substrates to be treated, are also referred to below as substrate carriers for differentiation purposes.

In an alternative variant of the method, all positions and test substrates required for a process run are arranged on one carrier, hereinafter also referred to as a test substrate carrier. If necessary, more than one test substrate carrier may be required. A test substrate carrier can be equipped exclusively with test substrates, i.e. without substrates to be treated, or alternatively predominantly with test substrates. The used and new test substrates are then exchanged between the individual positions on this test substrate carrier. This variant can be chosen if the arrangement of the substrates on the substrate carriers does not allow an additional placement of a test substrate for various reasons, such as the geometry of the substrates or due to the treatment circumstances. In this variant, the test substrates of a process run are only changed within the test substrate carrier.

In both variants, the method described offers the advantage that all the test substrates required for a process run are loaded into the system together with the substrates to be treated and are also unloaded again with them. This allows the carriers to remain in the substrate holder under process conditions during the test substrate change. The carriers do not cool down unevenly during the test substrate change. Further, the accompanying test substrates are at process temperature and thus have more reproducible properties. In addition, the duration of the test substrate change is significantly reduced. In addition, the second variant also provides a solution for substrate arrangements where no test substrate can be arranged on the carrier to be processed.

A treatment system with which the test substrate exchange method according to the invention can be carried out comprises at least one carrier, for example, but not limitingly, one turntable or a plurality of turntable segments, on which substrates to be treated are held and arranged opposite the relevant treatment source for treatment.

The one or more carriers used to carry out the method described above also have positions for a number n of test substrate positions in addition to the substrate positions. The minimum number of test substrate positions n required in total depends, among other things, on the number $N_B$ of treatment steps to be analyzed by means of one test substrate in each case:

$$n \geq N_B + m.$$

Obviously, n, $N_B$ and m are elements of natural numbers. Moreover, $m \geq 1$.

If the treatment method according to the invention has exactly one test substrate position (m=1) exceeding $N_B$ on the carriers involved in the method, there is always an empty position available for the intermediate storage of a test substrate during the exchange of the test substrates between the measuring and holding position, in addition to the untreated test substrates already treated and the test substrate currently to be treated. The definition of a constant measuring position in the substrate holder for all test substrates means that their treatment and subsequent monitoring of the treatment can take place for each treatment step in the same system position, viewed relative to the substrate transport path. This results in less effort and/or less space required for monitoring as well as a higher reproducibility of the monitoring.

In principle, more test substrate positions are also possible (m>1), for example to have more than one measuring position available. This may be the case if more than one monitoring device is desired at the treatment system or if optimized system positions are to be available for different monitoring methods. It may also be advantageous to exchange more than one test substrate between measuring and holding positions at the same time, so that more than one empty position is desired. However, the primary interest is often to use the available substrate holder for the maximum possible number of substrates to be treated in order to make the treatment method as effective as possible.

The number of test substrate positions that can be arranged on the individual carriers depends on the number of carriers used for a process run and on the number $N_B$ of treatment steps to be analyzed by means of one test substrate in each case. In various embodiments, as noted above, the test substrate positions may be grouped on one, or optionally more, test substrate carriers, or distributed among some or all of the substrate carriers. As a result, n≥1, preferably n≥2, more preferably n≥3, more preferably n≥5, more preferably n≥7, more preferably n≥10 test substrates and any intermediate value thereof may be arranged on one carrier.

Of the n test substrate positions, as described for the method, only one is regularly open towards the treatment source, so that the surface of a test substrate arranged there facing the treatment source can be treated there. The remaining test substrate positions are closed towards the treatment source. This can be accomplished by a suitable plate acting as a shield towards the treatment side, a closure in the carrier or in another suitable manner. Optionally, the empty position can also remain open, provided that this does not have a significant negative impact on the functionality of the treatment portion concerned. The shield may be fixed, detachable or pivotable. In the latter two embodiments, the test substrate positions can be used variably.

The treatment system further comprises at least one loading station for the test substrates, which is suitable for at least depositing and removing a test substrate relative to a test substrate position. The loading station may be partially or completely formed and arranged within the treatment chamber.

The loading station comprises a suitable gripper for grasping, holding, and re-depositing a test substrate at a test substrate location. The gripper may pick up a test substrate per se or a test substrate held in a holder by the gripper gripping the holder. For this purpose, and depending on the type of test substrates and, if applicable, their holders, the gripper may be equipped with different gripping means which use at least one of the mechanisms of action from the following list for picking up and depositing the test substrate: mechanical, electrical, pneumatic or magnetic holding. In the following, the gripping, holding or moving, in summary, is based on the test substrate merely for better understanding. However, it is intended to include both variants: the handling of a test substrate per se and one with a holder.

By means of the loading station, for the purpose of the test substrate change, various movements of at least the gripper are required to grip the test substrate, to lift it from the relevant test substrate position or to deposit it in a test substrate position. This relates to a translational movement, usually substantially perpendicular to the carrier surface and/or the surface of the substrates and test substrates to be handled. This movement is understood here as movement in the Z-direction, wherein this is not to be understood exclusively as an exactly perpendicular movement.

Depending on the position and shape of the carrier, deviations of a few degrees from the perpendicular may also be included. The Z direction is to be used here as a reference direction for the X-Y plane lying at right angles thereto and as the axis of a possible rotational movement.

Accordingly, the loading station is designed to perform movements of a test substrate at least in the Z-direction, optionally also in the X- and/or Y-direction and/or rotational movements about the Z-axis. The components of the loading station, which serve to execute the named movements, are to be summarized here as a movement unit for the purpose of description.

The loading station can have a heat shield with which at least the gripper, and optionally also other components of the loading station, are thermally shielded from the carrier. Optionally, the heat shield can be cooled actively or passively. In the first case, the heat shield is adjusted to a desired temperature by a suitable coolant. In the second case, the heat shield is in thermal contact with a cooler component of the treatment system in such a way that heat can be transferred from the heat shield to this component.

The loading station can be located on the side of the carrier facing away from the treatment source, so that the carrier protects the loading station from any unwanted influence of the treatment on the loading station. In the case of a treatment direction from bottom to top, the loading station can be mounted, for example, on the chamber lid of the system. Mounting on the chamber wall may also be suitable.

The loading station may have distance, proximity, and/or position sensors for detecting the location and holding of the test substrate.

The gripper may include an activatable and deactivatable magnet for receiving, holding and depositing the test substrate by means of a magnetizable component thereof, such as a frame or other holder. For example, a permanent magnet may be combined with a coil for deactivating the permanent magnet.

The gripper of the loading station can have a spring acting in the stroke direction in such a way that the end position of the gripper at the test substrate position can be cushioned. In this way, reproducible treatments and handling of the test substrate used in each case can be achieved. For example, damage to the carrier or existing holders of the test substrate or impairment of the treatment result due to even minor deviations in the position of the test substrate can be prevented.

The holder of the gripper can be adjustable with a variable angle of ±90°, to adapt to different test substrate positions.

A suitable component of the treatment device may include a reference position, particularly to calibrate the loading station relative to the occupied and unoccupied test substrate positions and to ensure reproducible positioning of each test substrate of the process run.

The invention will be explained in greater detail below with reference to exemplary embodiments. The associated drawing shows in FIG. 1 a turntable system in perspective view, FIG. 2*a* and FIG. 2*b* test substrates, respectively.

a turntable showing the alternative test substrate positions and

Figure 3:
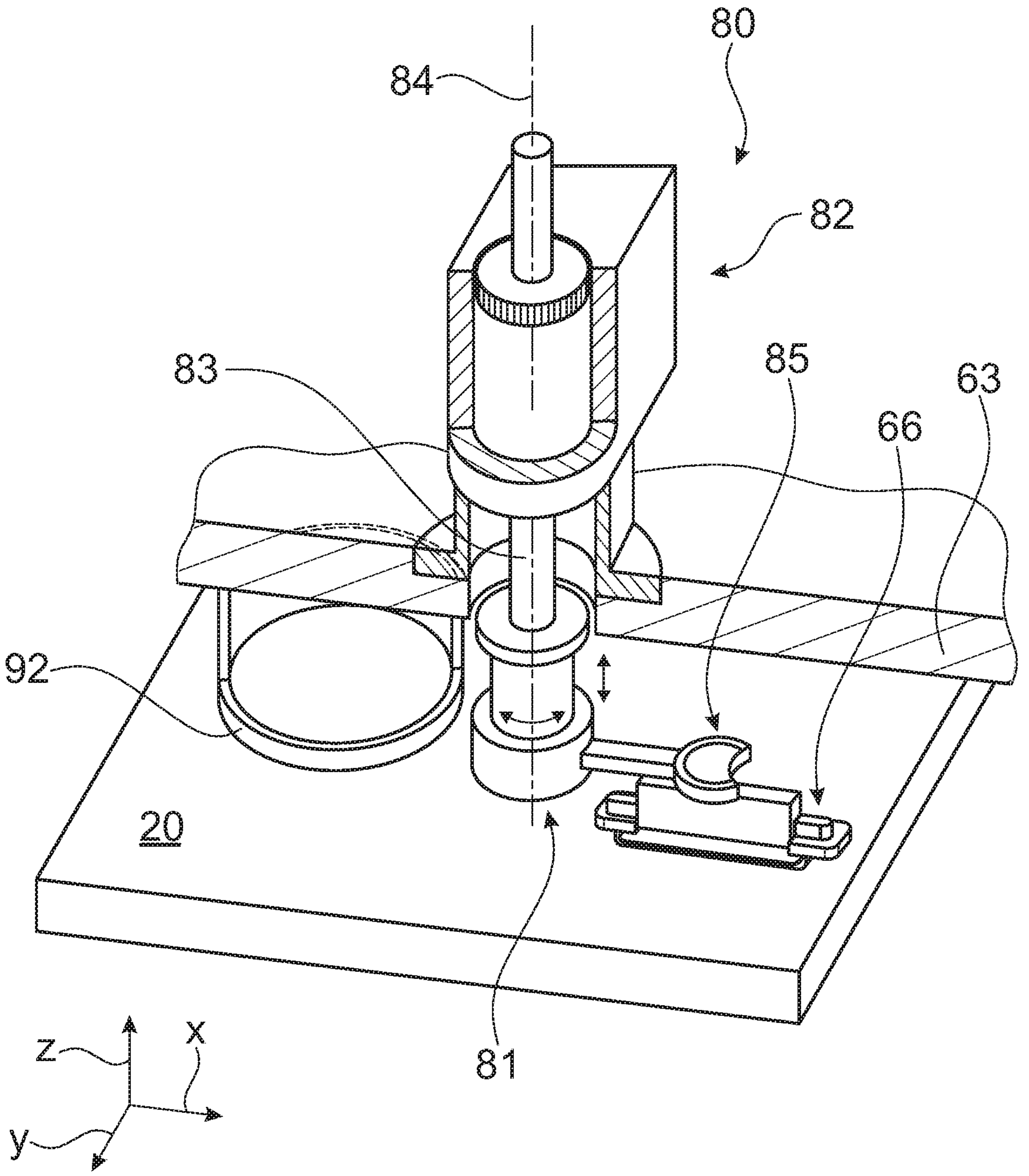

FIG. 3 a loading station mounted on the lid of the turntable system, and

Figure 4:
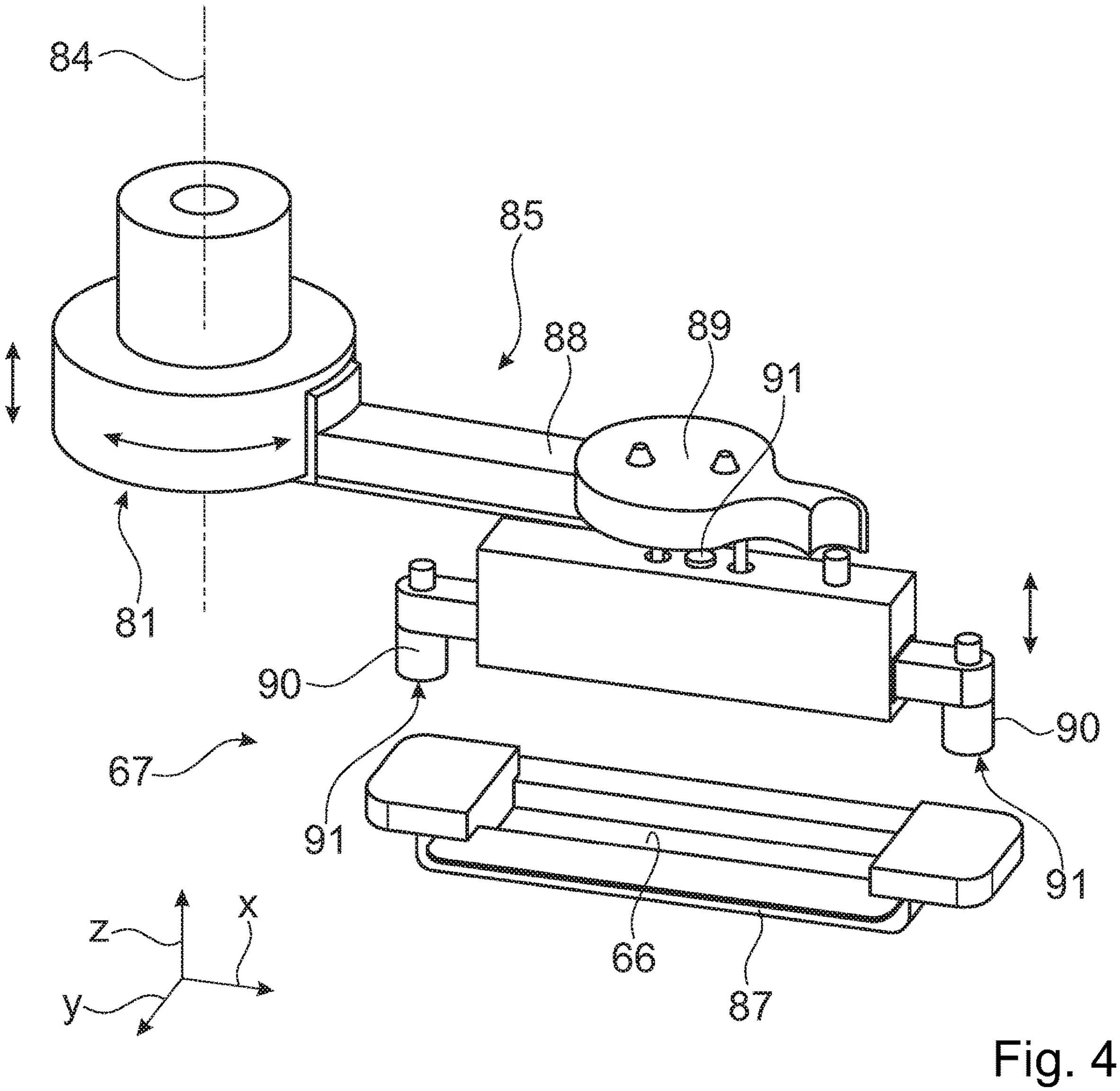

FIG. 4 a gripper of the loading station positioned over a test substrate.

The drawings show the device only schematically to the extent necessary to explain the invention. They do not claim to be complete or to be to scale.

The exemplary embodiment is intended to illustrate the invention only by way of example and not by way of limitation. The person skilled in the art would combine the features previously realized in the various embodiments of the invention and subsequently in the exemplary embodiment in further embodiments to the extent that appears to them to be expedient and useful.

FIG. 1 shows an open treatment system 60, which uses a holding device in the form of a segmented turntable 1 within its vacuum chamber 2. The treatment unit 60 has a circular structure and has distributed around its circumference a number of stations 60' . . . 60"" which serve directly or indirectly for the treatment of substrates 61. In the exemplary embodiment, optical glasses are coated. Glasses are also used as test substrates.

The turntable 1 is equipped with the segments 20, which act as carriers and, only by way of example, and not by way of limitation, accommodate two substrates to be treated. In a magazine station 62, there are arranged magazines (not shown), in which substrates 61 are held in substrate positions 64 of the segments 20. By rotating the turntable 1 by means of a suitable substrate transport device which carries out the rotation, the substrates 61 pass through the stations 60' . . . 60"" including the treatment station(s) at high frequency. Depending on the process step, the relevant station is activated and the process step is executed in this station on the rotating substrates. A process run comprises the activation of all stations required for substrate treatment one after the other. After completion of the process run, the segments 20 with the treated substrates 61 can be removed at the magazine station 62. It is apparent that the treatment station 60 is closed during treatment by means of its lid 63.

In the illustrated exemplary embodiment, the turntable 1 has a test substrate segment 65 on which, instead of substrates 61, a plurality of, by way of example but not by way of limitation, five test substrates 66 are arranged in the various, six test substrate positions 67 described above. One of the test substrate positions 67 remains free.

A loading station 80 is arranged on the lid 63 of the turntable system 60 and reaches through it into the turntable system 60. This serves to exchange the treated and untreated test substrates 66 within the test substrate positions 67. The loading station 80 is arranged opposite the magazine station 62 merely by way of example and not by way of limitation.

Figure 2A:
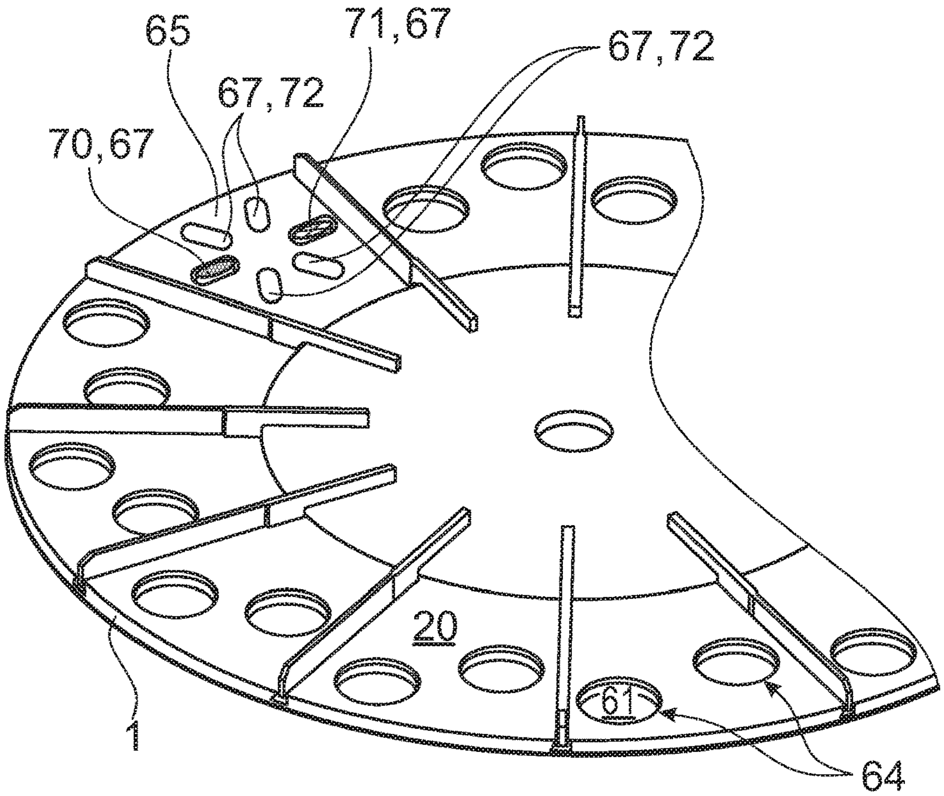

FIG. 2*a* shows a detail of the turntable 1 with the test substrate segment 65 according to FIG. 1. One of the exemplary six test substrate positions 67 shown there is the measuring position 70 and is equipped with a test substrate 66 in the application of the treatment method in order to be subjected to a treatment currently to be carried out for treatment, the turntable is rotated to such an extent that the test substrate segment 65 is located in the relevant station 60' . . . 60"".

A further test substrate position 67 is the empty position 71, which temporarily contains no test substrate and serves to change the four test substrates arranged in the remaining test substrate positions 67 one after the other to the measuring position 70. These four remaining test substrate positions 67 serve as holding positions 72, in which treated or still untreated test substrates 66 are held and protected from being influenced by the treatments during the process run.

Figure 2B:
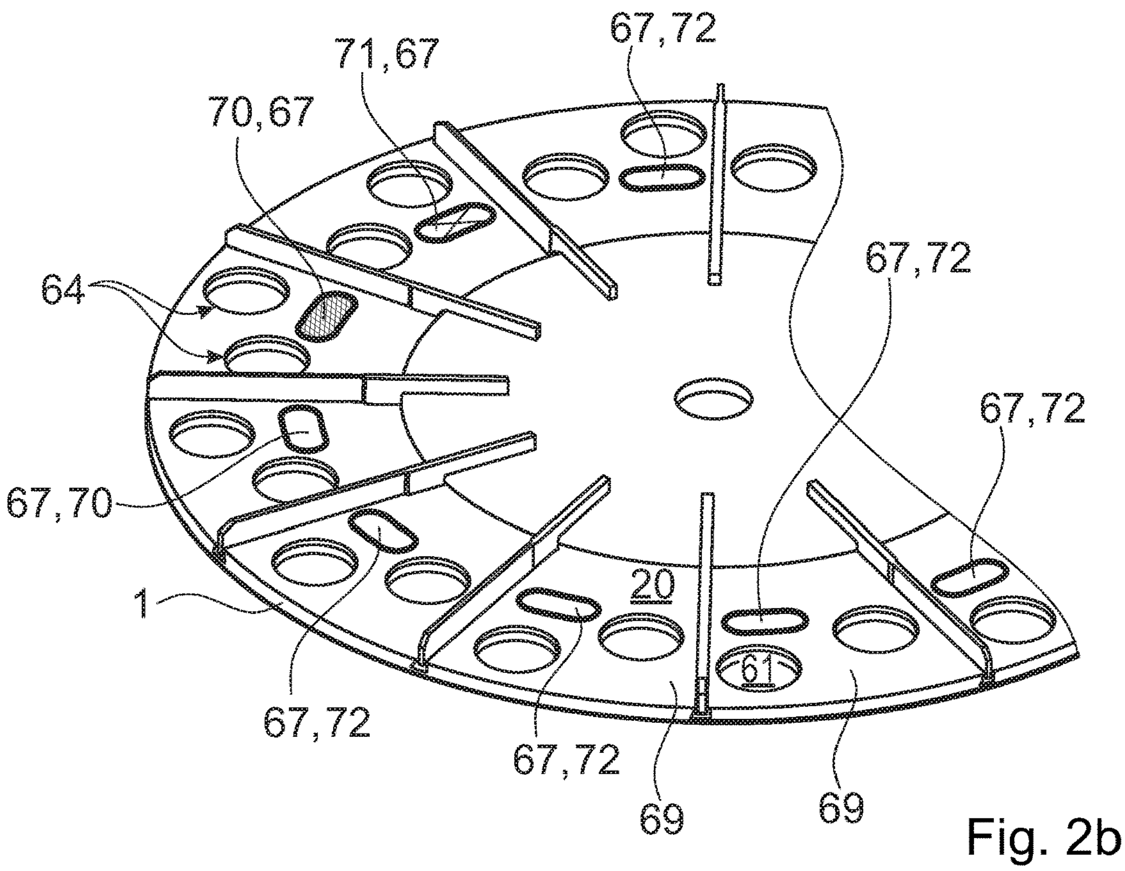

An alternative arrangement of the test substrate positions 67 is shown in FIG. 2*b*. There, for example, a test substrate position 67 is arranged on each of the segments 20 next to the substrates 61 to be treated. These segments 20 are designated as substrate segments 69 to distinguish them from the test substrate segments 65, which, as described for FIG. 2*a*, accommodate only test substrates 66 and no substrates 61. As described for FIG. 2*a*, two of these are the measuring position 70 and the empty position 71. These are located in adjacent substrate segments 69 merely by way of example. The holding positions 72 are distributed over the remaining segments 20.

In FIG. 2*a* and FIG. 2*b*, the measuring position 70 and the empty position 71 are marked with a hatching (measuring position 70) and a cross (empty position 71), respectively, for better differentiation.

FIG. 3 shows a loading station 80, which protrudes through the lid 63 into the turntable system 60. It is arranged on the lid 63 in such a way that it lies above the segments 20. For clarity and to generalize the description of the loading station 80, substrates 61 of the segment 20 are not shown.

The loading station 80 comprises a gripper 81 which is arranged in the turntable system 60 and a movement device 82, the latter being mounted, by way of example, but not by way of limitation, on the lid 63 and connected to the gripper 81 via a shaft 83.

The gripper 81 can be moved axially by means of the movement device 82.

Optionally, a movement of the gripper 81, relative to the central axis (not shown) of the turntable 1, and/or a radial movement of the gripping means 85, which is part of the gripper 81, relative to the shaft 83, can also be performed.

The gripper 81 comprises a suitable gripping means 85, which picks up the test substrate 66. It can, for example, be mounted on the gripper 81 like a cantilever.

The gripper and/or the gripping means 85 may rotate about the axis 84 defined by the shaft 83 and extending parallel to the Z-direction (represented by a coordinate system).

Due to the feasible movements of the gripping means 85 and in conjunction with an optimized position of the loading station 80, relative to the turntable 1 and the test substrate positions 67 there, the gripping means 85, can reach each of the test substrate positions 67 of the turntable 1.

The gripper in the embodiment of FIG. 3 further comprises a heat shield 92, which is arranged between the gripper 81 and the segment 20, so that it protects at least the gripper 81 or also the gripping means 85 from a damaging temperature load by the segment 20 during the process run. The design and operation of the heat shield 92 may be different, depending for example on the presence and/or type and extent of a cooling system. In the exemplary embodiment, the heat shield 92 is fixedly mounted to the chamber lid 63 and the gripping means 85 is pivotable behind the heat shield 92. Other embodiments are also possible. For example, the heat shield 92 may also be pivotable about its own axis, which may be parallel to the axis 84. Or, a combination of movements of both components is possible.

The interaction of the gripping means 85 with the test substrate 66 is shown in FIG. 4.

The test substrate 66 is or comprises the actual test substrate 86, which is held by a frame 87. Other designs of the test substrate 66 are also possible, for example, depending on the mechanism of action of the gripping means 85 or the substrate material or other conditions.

The gripping means 85 has a cantilever 88 which extends radially from the shaft 83. The free end portion 89 of the cantilever 88 has one or more magnetic holders 90 with planar receiving surfaces 91 arranged on the underside, which are designed and arranged to receive, hold and deposit the test substrate 66 on its metallic frame 87. To this end, the magnetic holders 90 comprise permanent magnets (not shown) and coils (not shown), which cooperate such that the magnetic field of the permanent magnets can be activated to receive the test substrate 66 and deactivated to deposit the test substrate 66.

The gripping means 85 and/or the gripper 82 include suitable sensor means (not shown) for detecting the relative positions and the approaching of the gripping means 85 and test substrate 66 relative to each other. For example, sensors may detect the height of the gripper, for example relative to a suitable reference point, or the position of the test substrate.

The magnetic holders 90 are directly or indirectly connected to the free endpiece 89 via a spring 91, so that the spring is loaded as a result of the contact between the magnetic holder 90 and the frame 87 of the test substrate 66, thus preventing a hard impact on the test substrate 66 when the contact is established, i.e. cushioning the receiving of the test substrate 66. In this way, it is also possible to compensate for different height positions of the individual test substrates.

The invention claimed is:

1. A method for changing test substrates, the method comprising a plurality of successive treatment steps in a continuous-flow vacuum system which has a plurality of treatment stations and a transport device comprising at least one carrier for holding both to-be-treated substrates and test substrates, and for transporting the to-be-treated substrates and the test substrates through the plurality of treatment stations, wherein:

at least two untreated test substrates are fed into the continuous-flow vacuum treatment system at a beginning of a process run and discharged after completion of the process run;

for each of at least two of the successive treatment steps, an untreated test substrate is treated together with the to-be-treated substrates;

after a first treatment step of the successive treatment steps, a first test substrate treated in the process run is removed from a measuring position on the at least one carrier occupied by the first test substrate during the first treatment step and is the deposited in an empty position on the at least one carrier having no test substrate; and after removal of the first test substrate treated in the process run, a second, still untreated test substrate is removed from a holding position on the carrier and is deposited in the measuring position, from which the first test substrate was removed, for the purpose of being fed to a subsequent treatment step of the successive treatment steps.

2. The method of claim 1, wherein the previously treated first test substrate is removed from the empty position and deposited in the previously vacated holding position or another holding position on the carrier that does not have a test substrate.

3. The method of claim 2, wherein more than two test substrates are supplied and the changing of the test substrates between measuring positions, empty positions, and holding positions is repeated after each treatment step until all test substrates are treated.

4. The method of claim 1, wherein the changing of the test substrates between measuring positions, empty positions, and holding positions is performed by a loading station of the continuous-flow vacuum system and the test substrates are moved between the positions by the transport device relative to the loading station for access to the test substrates.

5. The method of claim 4, wherein the loading station accesses the test substrates or holders of the test substrates using mechanical, electrical, pneumatic, or magnetic holding.

6. The method of claim 1, wherein the transport device comprises a plurality of carriers and the test substrates are changed between measuring positions and/or empty positions and/or holding positions either on the same carrier or on different carriers.

7. The method of claim 1, wherein a treatment result on the first test substrate treated in the process run is analyzed.

8. The method of claim 7, wherein for each treatment step of the process run to be monitored, a test substrate is introduced together with the to-be-treated substrates and is treated and analyzed in the measuring position, wherein the untreated test substrates are held in holding positions and are protected from treatment.

9. The method of claim 7, wherein the to-be-treated substrates and the test substrates are transported on a circular path through the treatment stations and are repeatedly exposed to treatment during a treatment step in the relevant treatment station, wherein for changing positions of the test substrates, the transport device is stopped in those positions in which a test substrate is required for the treatment, and wherein for changing positions of the test substrates, the transport device is stopped in those positions in which a loading station of the treatment device used for the test substrate change can access the test substrate position currently to be used.

* * * * *